United States Patent [19]

Strahm

[11] Patent Number: 5,170,437
[45] Date of Patent: Dec. 8, 1992

[54] AUDIO SIGNAL ENERGY LEVEL DETECTION METHOD AND APPARATUS

[75] Inventor: Chris N. Strahm, Portland, Oreg.

[73] Assignee: Audio Teknology, Inc., Portland, Oreg.

[21] Appl. No.: 599,295

[22] Filed: Oct. 17, 1990

[51] Int. Cl.$^5$ .............................................. H03G 7/00
[52] U.S. Cl. ...................................... 381/106; 381/107; 381/102; 381/22
[58] Field of Search ............... 381/106, 107, 101, 102, 381/22-27, 17

[56] References Cited

U.S. PATENT DOCUMENTS

| | | |
|---|---|---|
| 4,122,254 | 9/1978 | Blackmer . |
| 4,220,929 | 9/1980 | Talbot et al. . |
| 4,363,007 | 12/1982 | Haramoto et al. ................... 381/106 |
| 4,398,157 | 8/1983 | Dieterich . |
| 4,455,676 | 6/1984 | Kaneda . |
| 4,465,981 | 8/1984 | Pike . |
| 4,602,218 | 7/1986 | Vilmur et al. . |
| 4,922,535 | 5/1990 | Dolby .................................. 381/106 |

Primary Examiner—Jin F. Ng
Assistant Examiner—Nina Tong
Attorney, Agent, or Firm—Kolisch Hartwell Dickinson McCormack & Heuser

[57] ABSTRACT

An audio signal energy level detector for use with audio signal processing is described. The energy level detector includes a high-pass filter series-connected between an audio input signal and a series-connected rectifier and integrator the output of which is connectable to the control input of a variable gain device that processes the audio input signal. A characteristically −10 db/decade amplitude versus frequency slope audio input signal is high-pass filtered, rectified and smoothed to produce a constant-energy, DC gain control signal. When the audio input signal is processed in accordance with the invention by the variable gain device to produce an audio output signal suitable for dynamic, downstream processing, the tonal balance and timbre of the audio input signal are preserved. Passive and active, half-order, five-stage high-pass filters are described that provide the desired +10 db/decade amplitude versus frequency slope over the audio frequency range.

1 Claim, 1 Drawing Sheet

AUDIO SIGNAL ENERGY LEVEL DETECTION METHOD AND APPARATUS

BACKGROUND AND SUMMARY OF THE INVENTION

This application relates generally to audio level detection circuits for use in audio signal processing. More particularly, it concerns energy level detection method and apparatus that preserve the tonal balance of an audio input signal by detecting the spectral energy of the audio input signal over its dynamic frequency range and producing a gain control signal that is generally equally responsive to the high- and low-frequency components of the audio input signal.

Prior art audio level detectors ignore the negative amplitude versus frequency slope that is characteristic of audio signals, e.g. speech or musical program material. Conventionally, an audio signal level detector simply rectifies an audio input signal and integrates, or smooths, the rectified output to produce a direct current (DC) gain control signal—for use by a variable gain control device—the amplitude of which is directly proportional over the audio frequency spectrum to the amplitude of the audio input signal. Because of the characteristic nature of an audio input signal, in which lower frequencies tend to be of higher amplitude and higher frequencies tend to be of lower amplitude (in accordance with the so-called "pink noise" curve), the output of the variable gain device that processes the audio input signal is of constant amplitude, irrespective of the frequency of the audio input signal. One problem with variable gain devices so-controlled is a resultant shift of the tonal balance and a reduction of the timbre of the audio input signal so-processed to produce a gain-controlled audio output signal.

It is a principal object of the present invention to provide an audio signal energy, rather than amplitude, level detection circuit that preserves the tonal balance and timbre of the audio signal processed by a variable gain device controlled by the level detection circuit.

It is also an object of the invention to provide such a circuit with a filter having a predefined, positive, amplitude versus frequency slope characteristic over the audio frequency range.

An important object of the invention is to provide such a filter circuit the amplitude versus frequency slope in decibels per decade (db/decade) of which is approximately equal in magnitude to that of a characteristic audio input signal and of opposite sign.

Another important object of the invention is to provide such a circuit in a simple, easily manufactured configuration that contains a minimum of components.

Yet another object is to provide such an energy level detection circuit that is straightforwardly incorporated into existing audio signal processing circuits and systems.

In brief summary, the invention in its preferred embodiment comprises an audio input signal terminal having series-connected thereto a high-pass filter having an approximately +10db/decade slope substantially over the audio frequency range and a (preferably signal-smoothing) rectifier the output of which is connectable to the control input of a variable gain device through which the audio signal may be processed. The beneficial result of high-pass filtering the audio input signal before rectification (and smoothing) is that a control signal having an amplitude that is generally constant, despite the audio inputs signal's decreasing amplitude at higher frequencies, is presented to the variable gain control device. Illustrative high-pass filters include passive and active, half-order, five-stage, +10db/decade circuits.

DETAILED DESCRIPTION OF THE PREFERRED EMBODIMENT

Referring collectively to FIGS. 1 through 4, it will be appreciated that the block diagrams and circuits are appended by graphs that show the amplitude versus frequency characteristics of various signals. The graphs show (logarithmically scaled) frequency in Hz along the abscissa and relative amplitude (A) in decibels (db) along the ordinate. The origins ("0") of the graphs are labeled, and represent 0-Hz and 0-db. The graphs illustrate the characteristic slopes of the signal/response curves associated with various parts of the block diagrams and circuits and, importantly, demonstrate the differences between prior art audio signal processing circuits and the present invention.

Figure 1:
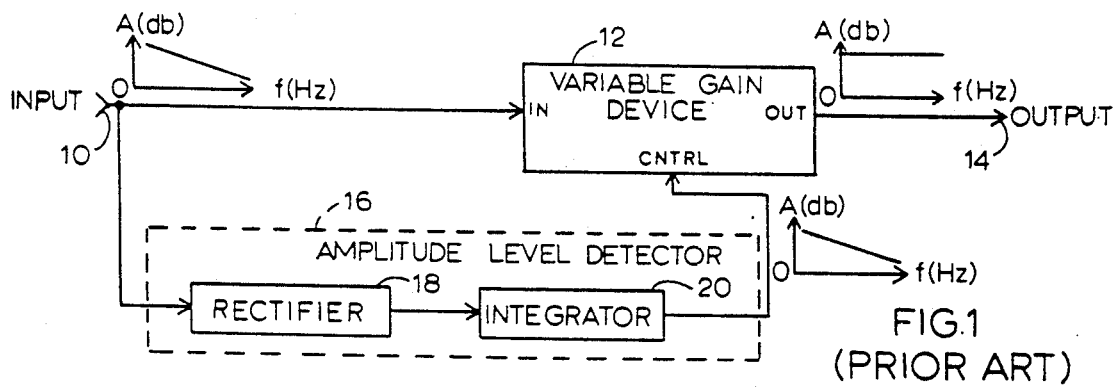
FIG. 1 is a block diagram of a prior art circuit that features amplitude level detection.

Referring first to FIG. 1, a prior art audio signal processing circuit is shown in block diagram form. It includes an audio input signal connected to an INPUT terminal 10 connected, in turn, to the input (IN) of a VARIABLE GAIN DEVICE 12 the output (OUT) of which is connected to an OUTPUT terminal 14. Those skilled in the art will appreciate that VARIABLE GAIN DEVICE 12 is conventional, and forms no part of the present invention. It is sufficient to say that VARIABLE GAIN DEVICE 12 produces an output (OUT) signal that is a function of its input (IN) signal, with the gain, which may be positive or negative, controlled by its control (CNTRL) input. With a positive control input, VARIABLE GAIN DEVICE 12 would operate, for example, to expand the audio input signal at INPUT terminal 10. With a negative control input, VARIABLE GAIN DEVICE 12 would operate, for example, to compress the audio input signal at INPUT terminal 10. By use of the circuit illustrated diagrammatically in FIG. 1, along with downstream audio signal processing circuitry or equipment, a variety of dynamic audio effects can be produced, e.g. signal compression, expansion, limiting, noise gating, de-essing, automatic gain control (AGC), etc.

One circuit conventionally used to control a variable gain device is an AMPLITUDE LEVEL DETECTOR 16. AMPLITUDE LEVEL DETECTOR 16 includes a RECTIFIER 18, which produces a DC output signal that is proportional to the amplitude of the alternating audio input signal impressed on INPUT terminal 10. Connected in series with RECTIFIER 18 is an INTEGRATOR 20, which integrates, or smooths, the DC output signal from RECTIFIER 18 to produce a relatively smooth DC control signal.

AMPLITUDE LEVEL DETECTOR 16 is so called because (as illustrated by the graph nearest its output signal) it produces an output signal over the audio frequency range that is directly proportional to the amplitude of the audio input signal at INPUT terminal 10 (as shown nearest INPUT terminal 10 in FIG. 2), which audio input signal may be seen to have the −10db/decade amplitude versus frequency slope that is characteristic of audio signals over the audio frequency range, i.e. from approximately 20-Hz to approximately 20,000-Hz. Notably, the output (OUT) signal from VARIABLE GAIN DEVICE 12 under control of AMPLITUDE LEVEL DETECTOR 16 has a constant amplitude over the audio frequency range (as shown graphically nearest the output of VARIABLE GAIN DEVICE 12 in FIG. 2). Thus, with prior art, amplitude level detectors, the output signal from a variable gain device controlled thereby exhibits a shift of the tonal balance and a reduction of the timbre of an audio signal processed therethrough, i.e. the audio output signal amplitude is generally constant, irrespective of large frequency-sensitive differences in the amplitude of the audio input signal.

Figure 2:
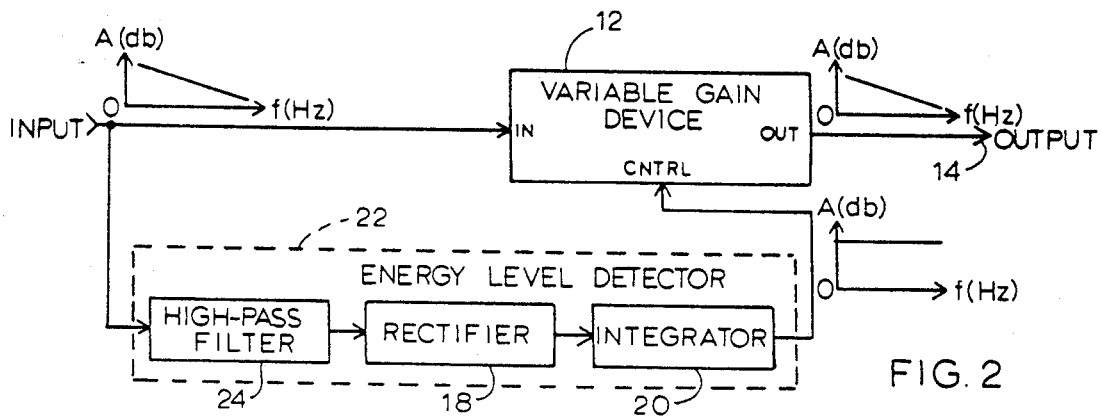
FIG. 2 is a block diagram of the apparatus of the invention in its preferred embodiment, as used in audio signal processing.

Turning now to FIG. 2, the invention in its preferred embodiment is described. It will be understood that functional blocks of FIG. 2 that are identical with those of FIG. 1 are identically designated, i.e. INPUT terminal 10, VARIABLE GAIN DEVICE 12, OUTPUT terminal 14, RECTIFIER 18 and INTEGRATOR 20 are conventional. Importantly, the invention in its preferred embodiment includes an audio input signal ENERGY LEVEL DETECTOR 22 interposed between INPUT terminal 10 and the control (CNTRL) input of VARIABLE GAIN DEVICE 12. Audio input signal ENERGY LEVEL DETECTOR 22 includes a HIGH-PASS input FILTER 24—i.e. a filter having a predefined characteristic of being dynamically more responsive to higher audio frequencies than to lower audio frequencies—that is directly operatively connected to an audio input signal impressed on INPUT terminal 10 and is upstream from RECTIFIER 18. In response to the impressed audio input signal, HIGH-PASS FILTER 24 produces a filtered audio signal that is generally constant over the audio frequency range. ENERGY LEVEL DETECTOR 22 also includes level detection means—including RECTIFIER 18, which preferably includes signal smoothing means, or INTEGRATOR, 20, operatively connected to input FILTER 24 and which is responsive to the filtered audio signal—for detecting the energy level in the filtered audio signal to produce a control signal proportional thereto, thereby to control an audio signal processor downstream from such audio input signal.

Another way of describing the present invention is as an audio signal level detection circuit. The level detection circuit includes audio INPUT signal terminal 10, a detector 22 including means for rectifying a signal input thereto via INPUT terminal 10 and smoothing the rectified output thereof, or RECTIFIER 18 and INTEGRATOR 20, to produce a smoothed DC output signal representing the approximate amplitude of the signal input thereto. The level detection circuit also includes HIGH-PASS FILTER 24 operatively connected between audio INPUT signal terminal 10 and detector 22. The audio signal level detection circuit thereby decreases the amplitude of the lower frequency components relative to the higher frequency components of the audio input signal impressed on INPUT signal terminal 10.

Yet another way of describing the present invention is as an audio signal energy level detector for use with a variable gain device having input and control terminals. The energy level detector includes filter means, or HIGH-PASS FILTER 24, responsive to an audio input signal impressed upon INPUT terminal 10, the filter means having a predetermined response (e.g. that shown graphically nearest the output of ENERGY LEVEL DETECTOR 22 in FIG. 2) that, as may be seen by reference to FIG. 2, attenuates low-frequency spectral components while passing high-frequency spectral components, thereby producing a generally constant output signal in response to a characteristically low-frequency/high-amplitude, high-frequency/low-amplitude audio signal (e.g. that shown graphically nearest INPUT signal terminal 10 in FIG. 2). The energy level detector also includes rectifier means, or at least RECTIFIER 18, and optionally and preferably also INTEGRATOR 20, responsive to the generally level output signal of the filter means to produce a control signal for connection with a control terminal of VARIABLE GAIN DEVICE 12, for processing the audio input signal at the input terminal of VARIABLE GAIN DEVICE 12, thereby to produce a gain-controlled audio output signal at OUTPUT signal terminal 14 for further downstream processing.

Those skilled in the art will appreciate that the invention represents a significant improvement over conventional audio input signal level detectors. Conventional audio signal processing circuits for processing an audio input signal having a predefined amplitude versus frequency slope, e.g. the so-called "pink noise" curve, include a variable gain control device controlled by a control signal produced by a series-connected rectifier an input of which is connected to an audio input signal terminal and an integrator an input of which is the rectified output of the rectifier. Such a circuit configuration, e.g. that shown in FIG. 1, achieves amplitude level detection and suffers an often undesirable shift in the tonal balance of the audio input signal. Timbre, which gives the spoken word and music their richness, is adversely affected because of the way conventional, amplitude level detection is accomplished.

The present invention, which constitutes an improvement over conventional audio signal processing circuits, accomplishes energy level detection for purposes of controlling the conventional variable gain device by the interposition of HIGH-PASS FILTER 24 between the audio input signal INPUT terminal 10 and the input of RECTIFIER 18. Preferably, HIGH-PASS FILTER 24 provides an approximately +10-db/decade amplitude versus frequency slope, which is seen to be of equal magnitude and opposite sign of the amplitude versus frequency slope that characterizes the audio input signal being processed by such audio signal processing circuits. Thus, the present improvement preserves the tonal balance and timbre of the audio input signal for further downstream processing.

The preferred audio signal processing method of the invention may now be understood in view of the above description of the preferred embodiment. The preferred method includes the steps of 1) impressing on an input terminal, e.g. INPUT terminal 10, an audio input signal characterized by relatively high-amplitude, low-frequency and low-amplitude, high-frequency components (as shown graphically nearest INPUT terminal 10 in FIG. 2); 2) high-pass filtering, e.g. via HIGH-PASS FILTER 24, the audio input signal impressed on the input terminal, thereby producing a filtered audio signal having approximately equal-amplitude, low-frequency and high-frequency components; and 3) rectifying, e.g. via RECTIFIER 18, the filtered audio signal to produce a DC control signal directly proportional to the filtered audio signal (as shown graphically nearest the output of ENERGY LEVEL DETECTOR 22 in FIG. 2), the control signal being connectable to a control input of a variable gain device, e.g. VARIABLE GAIN DEVICE 12, for processing the audio input signal, thereby to produce on an output terminal, e.g. OUTPUT terminal 14, for further downstream audio signal processing a modified audio output signal in such manner that at least one of (and preferably both of) the relatively high-amplitude, low-frequency and low-amplitude, high-frequency characteristics of the audio input signal is (are) preserved (as shown graphically nearest the output of VARIABLE GAIN DEVICE 12 in FIG. 2). To those skilled in the art it will be understood that the rectifying step preferably includes smoothing the rectified output, e.g. via INTEGRATOR 20 (which may be integral with RECTIFIER is) to produce the control signal that is connectable to the control input of the variable gain device.

Figure 3:
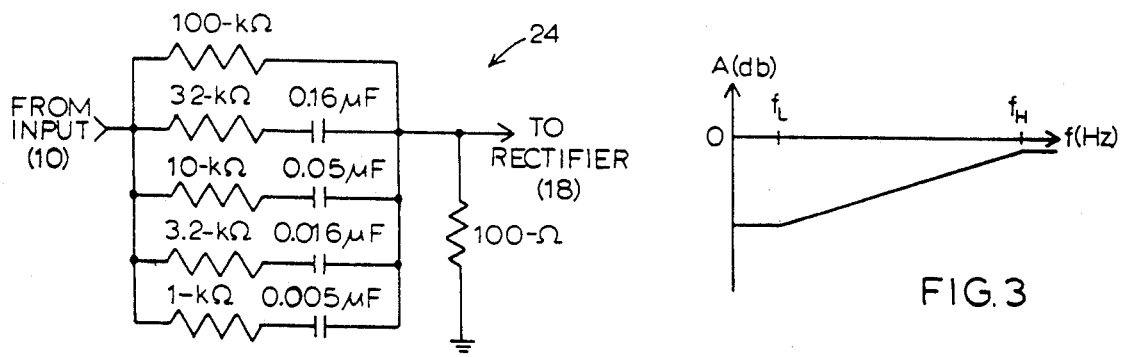
FIG. 3 is a detailed schematic diagram of a passive embodiment of the high-pass filter shown in FIG. 2.

Referring next to FIG. 3, a schematic diagram of HIGH-PASS FILTER 24 in a preferred embodiment is shown, along with an amplitude versus frequency graph of its frequency response. HIGH-PASS FILTER 24 in this embodiment is a passive, half-order, five-stage high-pass filter comprising a network of resistors and capacitors in the configuration and with the 32-kΩ/0.16-μF, 10-kΩ/0.05-μF, 3.2-kΩ/0.016-μF and 1-kΩ/0.005μF values shown. Those skilled in the art will appreciate that the series-connected resistor/capacitor combination in each parallel-connected stage provides a frequency corner that, in combination with the other stages including the 100-kΩ resistor-only stage (which passes a low-level signal of any frequency) provides a stepped linear approximation of the desired +10db-/decade slope over the audio frequency range from approximately 20-Hz to approximately 20,000-Hz (as shown graphically on the right side of FIG. 3, wherein filtering occurs over the audio frequency range extending from $f_L$ to $f_H$).

Figure 4:
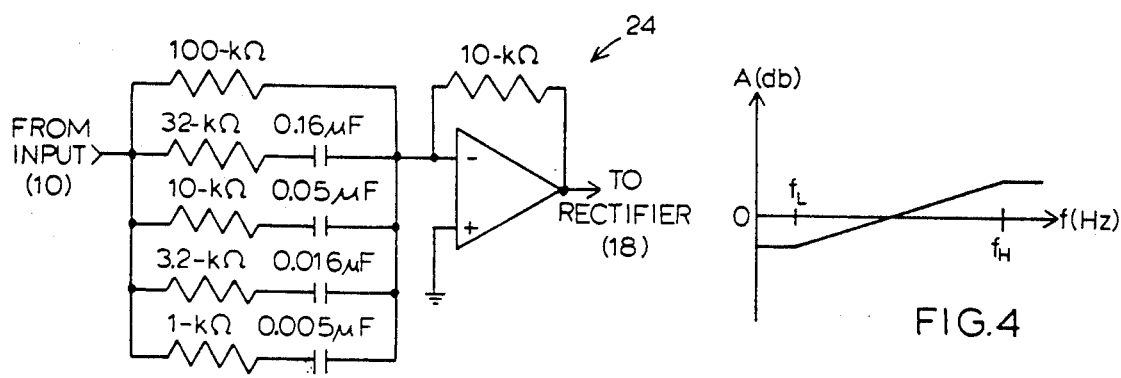
FIG. 4 is a detailed schematic diagram of an active embodiment of the high-pass filter shown in FIG. 2.

Referring finally to FIG. 4, a schematic diagram of HIGH-PASS FILTER 24 in an alternative preferred embodiment is shown, along with an amplitude versus frequency graph of its frequency response. HIGH-PASS FILTER 24 in this embodiment is an active, half-order, five-stage high-pass filter comprising the very same resistor-capacitor network as that of the passive filter, but, instead of having a 100-Ω resistor at the output, has an amplifier the gain of which is determined by a 10-kΩ feedback resistor. Those skilled in the art will appreciate that HIGH-PASS FILTER 24 in this alternative preferred embodiment similarly provides a frequency corner that, in combination with the other stages, provides a stepped linear approximation of the desired +10db/decade slope over the desired audio frequency range, while providing amplification of the high-frequency components as well as attenuation of the low-frequency components (as shown graphically on the right side of FIG. 4, wherein amplification/attenuation occurs over the audio frequency range extending from $f_L$ to $f_H$).

Skilled persons will appreciate that, within the spirit of the invention, HIGH-PASS FILTER 24 may have an amplitude versus frequency slope that is only nominally, rather than precisely, 10db/decade; may operate over a different frequency range; may utilize different circuit elements; and/or may be of an different circuit topology than that illustrated herein. Those of skill also will appreciate that ENERGY LEVEL DETECTOR 22 may use an alternative detection scheme and/or circuit topology, so long as it has a high-pass input filter capable of advantageously modifying the amplitude versus frequency characteristics of the audio input signal, prior to detection or rectification. It is this high-pass filtration that results in energy level detection rather than amplitude level detection, and the attendant preservation of the tonal balance and timbre of the audio input signal for downstream audio signal processing.

Accordingly, although preferred and alternative preferred embodiments of the invention, as well as a preferred method of practicing it, have been described, it should be appreciated that modifications may be made thereto without departing from the scope of the invention as defined in the appended claims.

It is claimed and desired to secure by Letters Patent:

1. In an audio signal processing circuit for processing an audio input signal having a predefined amplitude versus frequency slope, the processing circuit including a variable gain control device controlled by a control signal, the improvement comprising:

an energy level detection circuit operable over the audio frequency spectrum for monitoring the audio input signal and producing a control signal which is generally constant and proportional to the energy of the audio input signal, said energy level detection circuit including a half-order high-pass filter characterized by an amplitude versus frequency slope that is of substantially the same magnitude as that of the audio input signal and of opposite sign, wherein said filter is characterized by a slope of approximately +10 decibels per decade, and a series-connected rectifier and integrator, each having an input and output, wherein said input of said rectifier is operatively connected to said half-order high-pass filter and said input of said integrator is operatively connected to said output of said rectifier, and wherein said output from said integrator is used as a control signal to control such variable gain control device.

* * * * *